United States Patent [19]
Arai

[11] Patent Number: 5,822,346
[45] Date of Patent: Oct. 13, 1998

[54] SEMICONDUCTOR LASER CONTROL CIRCUIT CAPABLE OF SETTING ALL OUTPUT POWER LEVELS OF A SEMICONDUCTOR LASER BY MEANS OF SETTING ONLY ONE LEVEL

[75] Inventor: Kazuma Arai, Hachioii, Japan

[73] Assignee: Olympus Optical Co., Ltd., Tokyo, Japan

[21] Appl. No.: 787,541

[22] Filed: Jan. 22, 1997

[51] Int. Cl.$^6$ ........................................................ H01S 3/00
[52] U.S. Cl. ................................................................ 372/38
[58] Field of Search .................................................. 372/38

[56] References Cited

FOREIGN PATENT DOCUMENTS

2-68736  3/1990  Japan .

*Primary Examiner*—Rodney B. Bovernick
*Assistant Examiner*—Robert E. Wise
*Attorney, Agent, or Firm*—Armstrong, Westerman, Hattori, McLeland & Naughton

[57] ABSTRACT

In response to the output of an operational amplifier, a CPU sets via an R-D/A converter an R-constant current circuit for supplying a read power current Ir to a semiconductor laser thereby driving it, and also sets via a W0-D/A converter an W0-constant current circuit for supplying a first write power current Iw0 to the semiconductor laser thereby driving it. The output of the W0-D/A converter is applied to two voltage-controlled amplifiers so that W1-constant current circuit and W2-constant current circuit provide second and third write power currents Iw1 and Iw2, respectively, to the semiconductor laser in accordance with the outputs of the respective voltage-controlled amplifiers. The gains of these two voltage-controlled amplifiers are set by the CPU such that the gains corresponds to the ratios of Iw1 and Iw2 relative to Iw0. Thus a semiconductor laser control circuit for controlling the operation of driving a semiconductor laser at a plurality of power levels can be realized using a single low-speed semiconductor laser monitor without having to use three high-speed APC circuits. This allows a reduction in the cost of the semiconductor laser control circuit. A plurality of constant current circuits are set to have an equal gain so that the output power of the semiconductor laser control circuit may be easily set using the optimized optical output power setting value which has been already determined. This allows the test light emission for setting the power to be performed in a simple manner and thus resulting in a reduction in time required to perform the test light emission for setting the power level.

6 Claims, 11 Drawing Sheets

SEMICONDUCTOR LASER CONTROL CIRCUIT CAPABLE OF SETTING ALL OUTPUT POWER LEVELS OF A SEMICONDUCTOR LASER BY MEANS OF SETTING ONLY ONE LEVEL

BACKGROUND OF THE INVENTION

1. Field of the Invention

The present invention relates to a semiconductor laser control circuit for controlling the laser beam emitted by a semiconductor laser to illuminate an optical recording medium.

2. Related Art Statement

Figure 10:
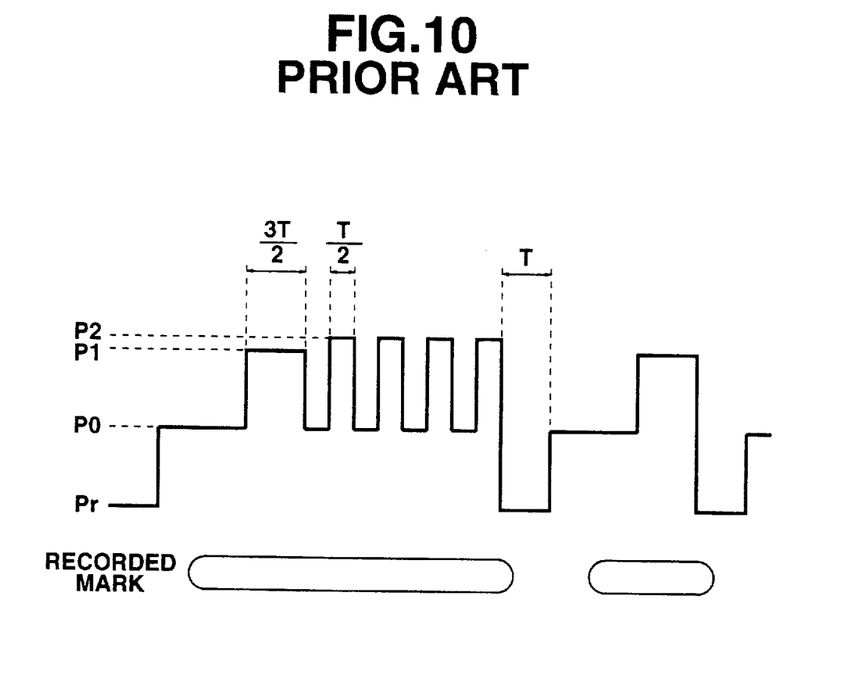
FIG. 10 is a waveform diagram illustrating a pulse waveform generated by a conventional semiconductor control circuit to drive a semiconductor laser.

A mark edge recording technique is known as a high-density optical-disk recording technique. In this technique, if a laser is driven by a laser driving current with a simple pulse waveform, accumulation of heat occurs, which causes recorded marks to be distorted into the shape of a teardrop. This distortion causes a problem particularly in the mark edge recording scheme in which data is represented by the length of each recorded mark. That is, the distortion in the mark shape can result in an increase in error during a reproducing operation. One known technique for avoiding the above problem is to drive a laser at a plurality of power levels as shown in FIG. 10. This technique is known as the recording waveform correction.

A semiconductor laser control circuit for achieving the multiple-power-level recording is disclosed for example in Japanese Unexamined Patent Publication No. 2-68736 (1990).

Figure 11:
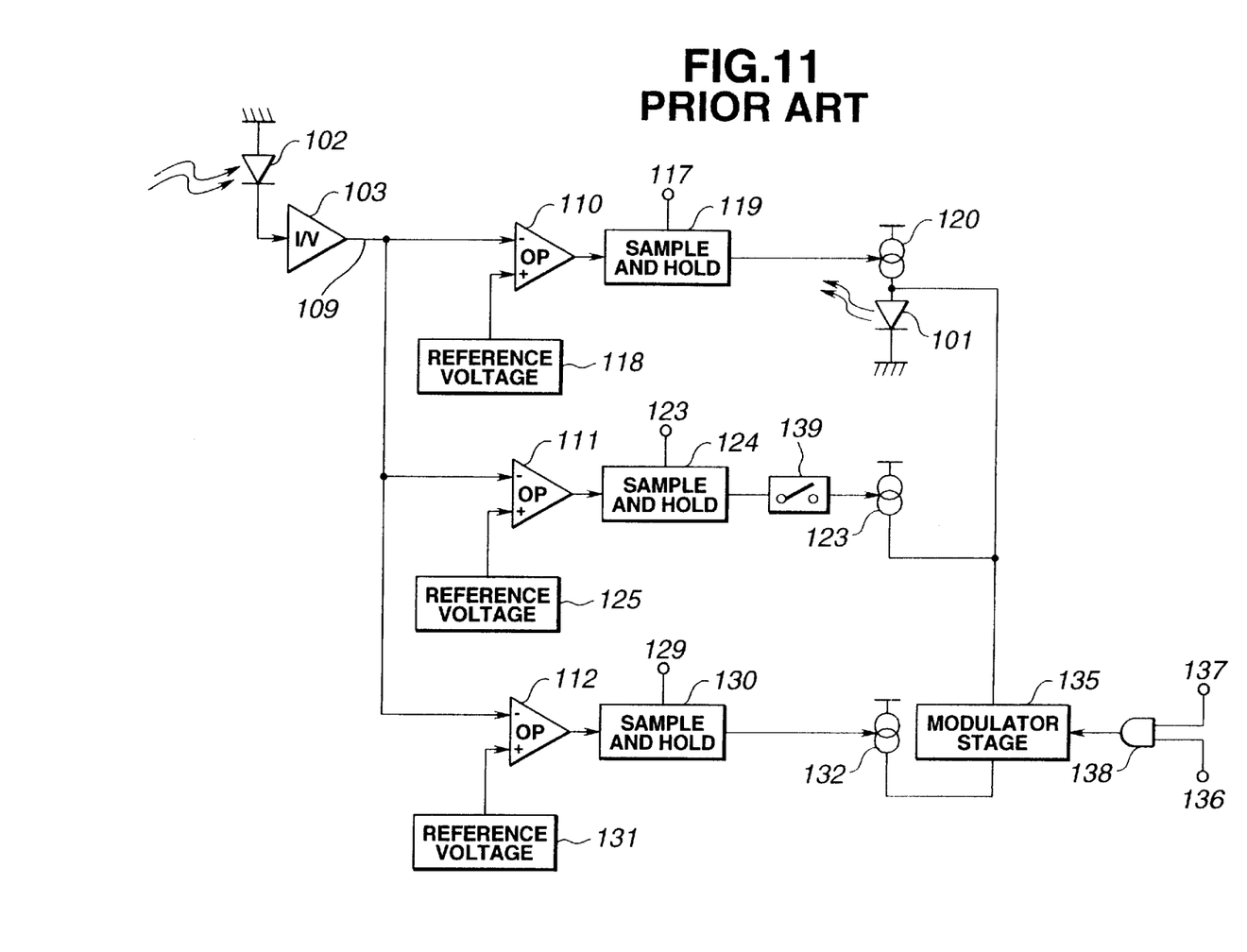
FIG. 11 is a circuit diagram illustrating the construction of the conventional semiconductor laser control circuit.

In this semiconductor laser control circuit disclosed in Japanese Unexamined Patent Publication No. 2-68736, as shown in FIG. 11, the optical output of a semiconductor laser 101 is detected by a photo detector 102, and the detected signal in current form is converted into voltage form by an operational amplifier 103. The output of the operational amplifier is applied as an optical power control error signal 109 to operational amplifiers 110, 111, and 112 which form a servo system.

Figure 12A:
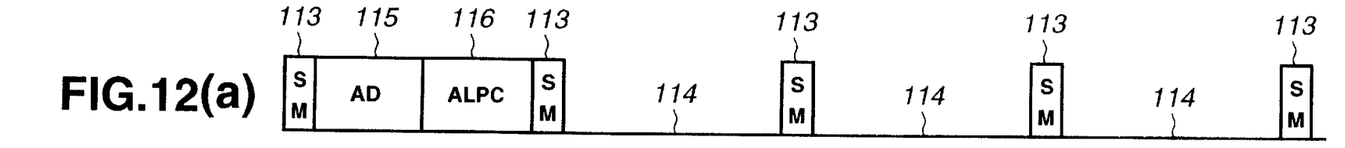

In a typical format used in a magneto-optic recording disk, a sector includes a plurality of recording areas (hereafter referred to as MO areas) 114, as shown in FIG. 12(a). Each sector includes preformatted sector marks (SM) 113 located immediately in front of the respective MO areas 114, wherein each sector mark 113 is made for example in the form of a wobble pit by which tracking servo control is performed. Following the first sector mark 113, there are provided a sector address (AD) area 115 and an ALPC (auto laser power control) area 116 wherein the sector address area 115 indicates the sector address and the ALPC area is used to set the optical power levels in reproducing, erasing, and recording operations. FIG. 12(g) illustrates the waveform of the optical output of the semiconductor laser 101 whose output levels are set in the ALPC area.

In FIG. 11 when a reproduction sample gate signal 117 is at a high level, a reproduction sample-and-hold circuit 119 performs a sampling operation. The operational amplifier 110 compares the optical power control error signal 109 with a reproduction reference voltage 118. In accordance with the comparison output of the operational amplifier 110, a reproducing current source 120 is driven, and thus the DC optical-power in the reproducing operation is set to a corresponding level (as represented by reference numeral 121 in FIG. 12(g)). When the reproduction sample gate signal 117 is at a low level, the reproduction sample-and-hold circuit 119 holds the signal received from the operational amplifier 110 so that the DC optical-output power is maintained at the fixed level (as denoted by reference numeral 122 in FIG. 12(g)). The waveform of the reproduction sample gate signal 117 is shown in FIG. 12(d).

In FIG. 11, when a bottom-value sample gate signal 123 is at a high level, a bottom-value sample-and-hold circuit 124 performs a sampling operation. The operational amplifier 111 compares the optical power control error signal 109 with a bottom-value reference voltage 125. In accordance with the comparison output of the operational amplifier 111, a bottom-value current source 126 is driven, and thus the DC bottom-value optical-power (in the erasing operation) is set to a corresponding level (as shown by reference numeral 127 in FIG. 12(g)). When the bottom-value sample gate signal 123 is at a low level, the bottom-value sample-and-hold circuit 124 holds the signal received from the operational amplifier 111 so that the DC bottom-value optical-output power is maintained constant (as denoted by reference numeral 128 in FIG. 12(g)). The waveform of the bottom-value sample gate signal 123 is shown in FIG. 12(e).

In FIG. 11, when a peak-level sample gate signal 129 is at a high level, a peak-value sample-and-hold circuit 130 performs a sampling operation. The operational amplifier 112 compares the optical power control error signal 109 with a peak-value reference voltage 131. In accordance with the comparison output of the operational amplifier 112, a peak-value current source 132 is driven, and thus the DC peak-value optical-power (in the recording operation) is set to a corresponding level (as represented by reference numeral 133 in FIG. 12(g)). When the peak-value sample gate signal 129 is at a low level, the peak-value sample-and-hold circuit 130 holds the signal received from the operational amplifier 112 so that the DC peak-value optical-output power is maintained constant (as denoted by reference numeral 134 in FIG. 12(g)). The waveform of the peak-value sample gate signal 129 is shown in FIG. 12(f).

Figures 12B, 12C:
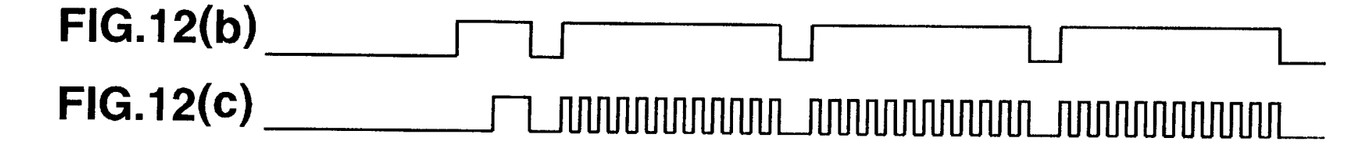
Figure 12D:
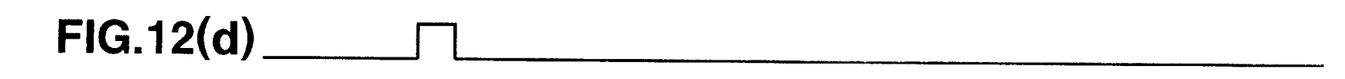
Figure 12E:
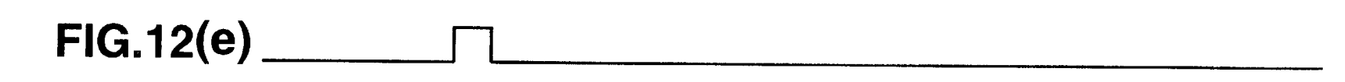
Figures 12F, 12G:
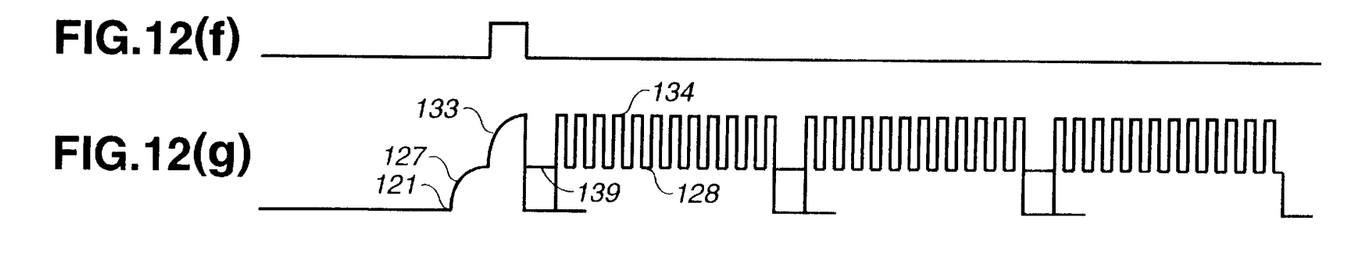

A modulator stage 135 modulates the optical output power by driving the semiconductor laser 101 with pulse currents having fixed peak and bottom values in accordance with the recording signal 136 as shown in FIG. 12(c). In response to a write gate signal 137, a gate 138 performs gating operation in terms of the recording signal 136. The write gate signal 137 is also used to control the on/off operation of the bottom-value current source switch 139. The waveform of the write gate signal 137 is shown in FIG. 12(b).

In the conventional technique, as described above, it is required that the power level be set by performing test light emission in an ALPC area disposed between a preformatted area and an MO area in a sector as shown in FIG. 12(a) using a circuit such as that shown in FIG. 11. Thus, it is required to set the power for the three different levels in the ALPC area to obtain a corrected recording waveform (write current waveform) such as that shown in FIG. 10.

In the case of a single-pit recording technique in which recording is performed with a single-level optical power, it is possible to set the power in the ALPC.

However, if the circuit shown in FIG. 11 is applied to a high-density recording disk (according to the long-pit Z-CAV recording scheme), the ALPC has only 6 bytes (72 channel bits) in the case of a 130-mm 2.6-GB magneto-optic disk (according to the standard SC23/WG2N 776) as shown in Table 1.

TABLE 1

| Gap | Flag | Gap | ALPC |
|-----|------|-----|------|
| 5   | 5    | 2   | 6    |

In this standard, if the disk rotation speed is selected to 3600 rpm, the channel clock frequency at the outermost zone (33 bands, 1024-byte/sector) of the Z-CAV disk is as high as 67 MHz and the ALPC passing time is as short as 1.075 $\mu$sec. To successfully perform the power setting for all the three levels shown in FIG. 10, it is required to complete the power setting for each level in about 300 nsec ($\approx$1.075 $\mu$sec/3). To achieve ±1% accuracy in the above power setting, the semiconductor laser APC (auto power control) loop for each channel in FIG. 11 is required to have a wide frequency bandwidth greater than 17 MHz (17 MHz$\approx$(300 nsec/5)$^{-1}$). This bandwidth is nearly equal to the RF bandwidth of an optical disk recording/reproducing apparatus.

Therefore, it is required that circuit sections, such as the photo detector for monitoring the semiconductor laser output, current-to-voltage conversion circuit, operating circuit, and sample-and-hold circuit, be all constructed with components capable of operating over the wide frequency band. Furthermore, three sets of such the wide-band circuit are needed for the respective output levels. This causes the circuit to be complex and expensive.

Another technique for setting the power is to perform test light emission in test zones or manufacturer zones provided across 100 or more tracks in non-user areas located in an inner or outer portion of the disk. Also in this case, it is required to separately set the power for all three levels, and thus the time required to set the power is three times longer than required for the one-level power setting.

OBJECTS AND SUMMARY OF THE INVENTION

It is an object of the present invention to provide a semiconductor laser control circuit capable of setting the power for all of a plurality of output power levels simply by setting the output power for only one of the plurality of output power levels.

It is another object of the present invention to provide a semiconductor laser control circuit capable of setting the power by simple test light emitting operation in a short time.

To achieve the above objects, a semiconductor control circuit of the invention includes: a semiconductor laser for illuminating an optical recording medium with a laser beam; first current setting means for setting a first driving current by which the semiconductor laser is driven; first current supplying means for supplying the first driving current to the semiconductor laser; second current setting means for setting a second driving current for driving the semiconductor laser, the second driving current being set on the basis of the output value of the first current setting means; second current supplying means for supplying the second driving current to the semiconductor laser; photo detector means for detecting the laser beam emitted by said semiconductor laser; current-to-voltage conversion means for converting a current signal supplied from the photo detector means into a voltage signal; power setting means for setting the optical output power of the semiconductor laser at one or more levels; comparison means for comparing the output of the power setting means with the output of the current-to-voltage conversion means; and control means for controlling the setting operation of the first current setting means in accordance with the comparison result of the comparison means.

These and other features and advantages of the present invention will be more readily apprehended from the following detailed description.

BRIEF DESCRIPTION OF THE DRAWINGS

FIGS. 1 to 5 relate to a first embodiment of the present invention wherein:

FIGS. 6 to 9 relate to a second embodiment of the present invention wherein:

FIG. 12($a$) illustrates the format of a magneto-optic disk which is illuminated by a laser beam emitted by a semiconductor laser controlled by the semiconductor laser circuit shown in FIG. 11; FIG. 12($b$) illustrates the waveform of the write gate signal generated in the semiconductor laser control circuit shown in FIG. 11; FIG. 12($c$) illustrates the waveform of the recording signal generated in the semiconductor laser control circuit shown in FIG. 11; FIG. 12($d$) illustrates the waveform of the reproduction sample gate signal generated in the semiconductor laser control circuit shown in FIG. 11; FIG. 12($e$) illustrates the waveform of the bottom-value sample gate signal generated in the semiconductor laser control circuit shown in FIG. 11; FIG. 12($f$) illustrates the waveform of the peak-value sample gate signal generated in the semiconductor laser control circuit shown in FIG. 11; and FIG. 12($g$) illustrates the waveform of the optical output of the semiconductor laser driven by the semiconductor laser control circuit shown in FIG. 11.

DETAILED DESCRIPTION OF THE PREFERRED EMBODIMENTS

The present invention will be described in greater detail below with reference to preferred embodiments in conjunction with the accompanying drawings.

First Embodiment

Construction

Figure 1:
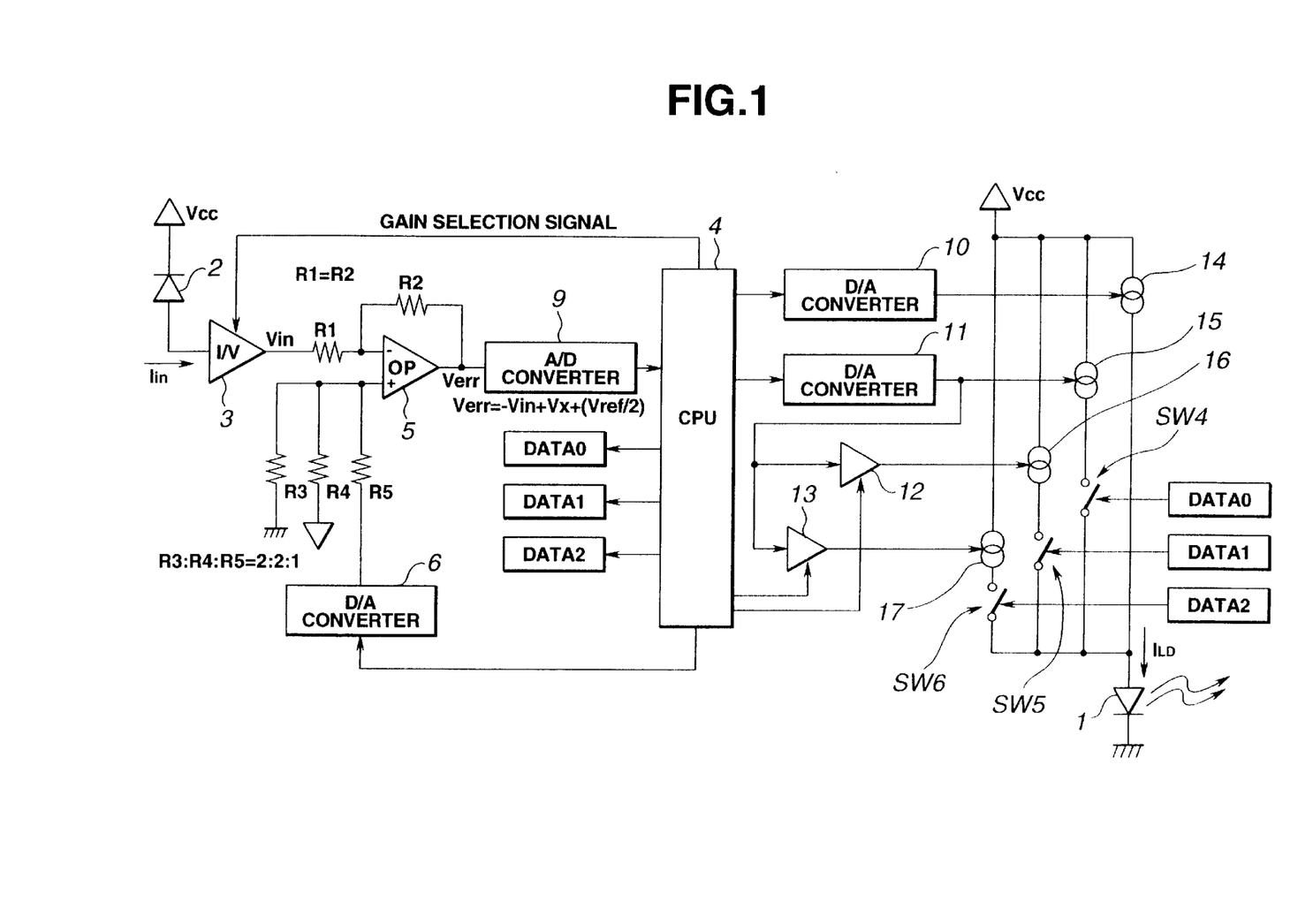
FIG. 1 is a circuit diagram illustrating the construction of a semiconductor laser control circuit.

In a semiconductor laser driving circuit according to a first embodiment of the invention, as shown in FIG. 1, the optical output of a semiconductor laser (LD) 1 is detected by a photo detector 2 and the detected signal in current form is converted into voltage form by a current-to-voltage conversion circuit 3 wherein the conversion gain of the current-to-voltage conversion circuit 3 is selected from two or more available values in accordance with the output mode of the semiconductor laser 1. That is, a CPU 4 sets the current-to-voltage conversion circuit 3 to have a high gain when the optical output power of the semiconductor laser 1 is at a read-mode level (low level) whereas the current-to-voltage conversion circuit is set have a low gain when the optical output power of the semiconductor laser 1 is at a write/erase-mode level (high level). This allows three digital-to-analog converters for specifying the optical output power level to be used both in read and write/erase operation modes.

The voltage signal output by the current-to-voltage conversion circuit 3 is applied to the negative input terminal of an operational amplifier (OP) 5 via a resistor R1. The positive input terminal of the operational amplifier 5 is connected to a digital-to-analog (D/A) converter 6 via a resistor R5, to a reference voltage (Vref) via a resistor R4, and to ground via a resistor R3. The values of the resistors are selected as follows:

$$R1=R2, R3:R4:R5=2:2:1.$$

Under the control of the CPU 4, the D/A converter 6 outputs a voltage corresponding to the output power of the semiconductor laser 1.

The output of the operational amplifier 5 is applied to an analog-to-digital (A/D) converter 9. The analog-to-digital converter 9 converts the received signal into digital form and supplies the resultant digital signal to the CPU 4. Depending on the output of the operational amplifier 5 and via an R-D/A converter 10 and a W0-D/A converter 11 for setting the semiconductor laser driving current for read, write, and erase modes, the CPU 4 sets an R-constant current circuit 14 for supplying a read power current (Ir) to the semiconductor laser 1 thereby driving it and also sets a W0-constant current circuit 15 for supplying a first write power current (Iw0) to the semiconductor laser 1 thereby driving it. The output of the W0-D/A converter 11 is applied to two voltage-controlled amplifiers 12 and 13 so that W1-constant current circuit 16 and W2-constant current circuit 17 provide second and third write power currents (Iw1 and Iw2), respectively, to the semiconductor laser 1 in accordance with the output of the voltage-controlled amplifiers 12 and 13. The gains of these voltage-controlled amplifiers 12 and 13 are set by the CPU 4 such that Iw1 and Iw2 have proper values corresponding to the ratios of Iw1 and Iw2 relative to Iw0. It is assumed here that the W0-constant current circuit, the W1-constant current circuit 16, and the W2-constant current circuit 17 all have the same voltage-to-current conversion gain.

The semiconductor laser 1 is driven by turning on and off the switches SW1, SW2, and SW3 depending on the operation mode (read, write, or erase mode) so that currents Iw0, Iw1, and Iw2 are supplied to the semiconductor laser 1 thereby driving it.

Operation

The operation will now be described below for each mode. In the read mode, the power is set as follows. The CPU 4 turns off the switches SW1, SW2, and SW3 (into open states) and sets the current-to-voltage conversion circuit 3 to have a read-mode gain.

The CPU 4 then sets the D/A converter 6 so that its output corresponds to a target power and also sets the R-D/A converter 10 so that the R-constant current circuit 14 can provide a specified output current in accordance with the output of the R-D/A converter 10. In the above setting, the output of the R-D/A converter 10 is set to a value which has been determined and stored (learned) in the CPU 4 during a test light emitting operation performed in advance, as will be described later. The light emission in the read mode is performed in accordance with the above conditions.

During the light emitting operation in the read mode, the CPU 4 periodically checks the output of the operational amplifier 5 via the A/D converter 9 and corrects the setting of the R-D/A converter 10 so that the output of the A/D converter 9 is maintained within a predetermined allowable bit range (so that the output of the operational amplifier 5 becomes equal to Vref/2). In this operation, the output of the R-D/A converter specifying the output current may be corrected each time the output of the A/D converter 9 is checked at the predetermined constant time intervals or may also be corrected to an optimum value determined by the CPU 4 by means of averaging a plurality of output values of the A/D converter 9.

The output current Iw0 for the write/erase mode is set as for the read mode by performing in advance test light emission. By the test light emission, the optimum current setting value (for the W0-D/A converter 11) associated with the optical output power is leaned. The CPU 4 sets the output current Iw0 using the above optimum current setting value. For other output currents Iw1, and Iw2, the CPU 4 determines the gains of the voltage-controlled amplifiers 12 and 13 from the ratios of Iw1 and Iw2 to Iw0 thereby setting these output currents Iw1 and Iw2.

In the erase-mode operation, the CPU 4 sets the W0-D/A converter 11 and the voltage-controlled amplifier 12 so that the W0-constant current circuit 15 and the W1-constant current circuit 16 provide the corresponding currents. The CPU 4 turns on the switches SW1 and SW2 in response to the erase gate. Although in this specific embodiment the W0-constant current circuit 15 and the W1-constant current circuit 16 are employed as the erase current supplying circuits, other combinations of constant current circuits for example either the W0-constant current circuit 15 and the W2-constant current circuit 17 or all the W0-constant current circuit 15, the W1-constant current circuit 16, and the W2-constant current circuit 17 may also be employed. In any case, the R-constant current circuit 10 is used to supply a bias current (threshold current) to the semiconductor laser.

In the write-mode operation, the CPU 4 sets the W0-D/A converter 11 and the voltage-controlled amplifiers 12 and 13 so that the W0-constant current circuit 15, the W1-constant current circuit 16, and the W2-constant current circuit 17 provide specified currents. The CPU 4 turns on and off the switches SW1, SW2, and SW3 in response to the write data thereby supplying the driving current ILD to the semiconductor laser 1 as shown in FIG. 2.

Figure 2:
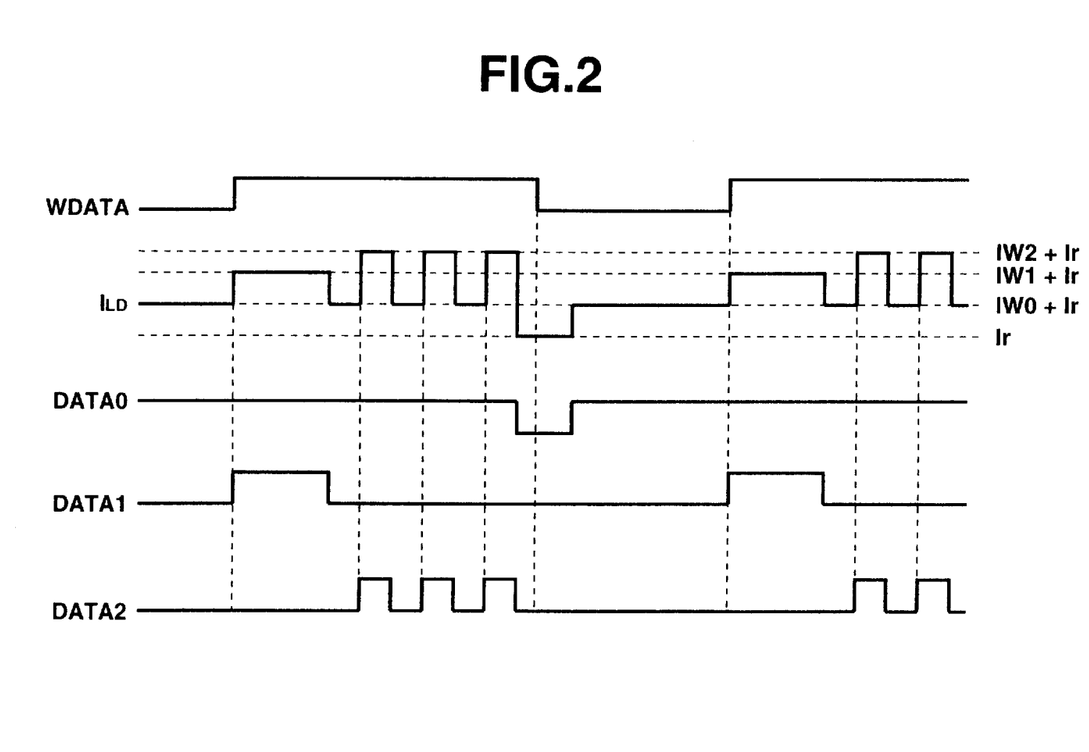
FIG. 2 is a timing chart illustrating the timing associated with the signal generated by the semiconductor laser control circuit shown in FIG. 1.

That is, as shown in FIG. 2, the switches SW1, SW2, and SW3 turn on and off in response to DATA1, DATA2, and DATA3 which are generated by the CPU 4 in accordance with write data (WDATA), thereby supplying the driving current ILD via the W0-D/A converter 11 and the voltage-controlled amplifiers 12 and 13.

The test light emitting operation is performed in predetermined test zones or manufacturer zones disposed across 100 or more tracks in non-user areas in an inner or outer disk portion.

The test light emitting operation for setting the read power will be described in greater detail below with reference to the flow chart of FIG. 3.

Figure 3:
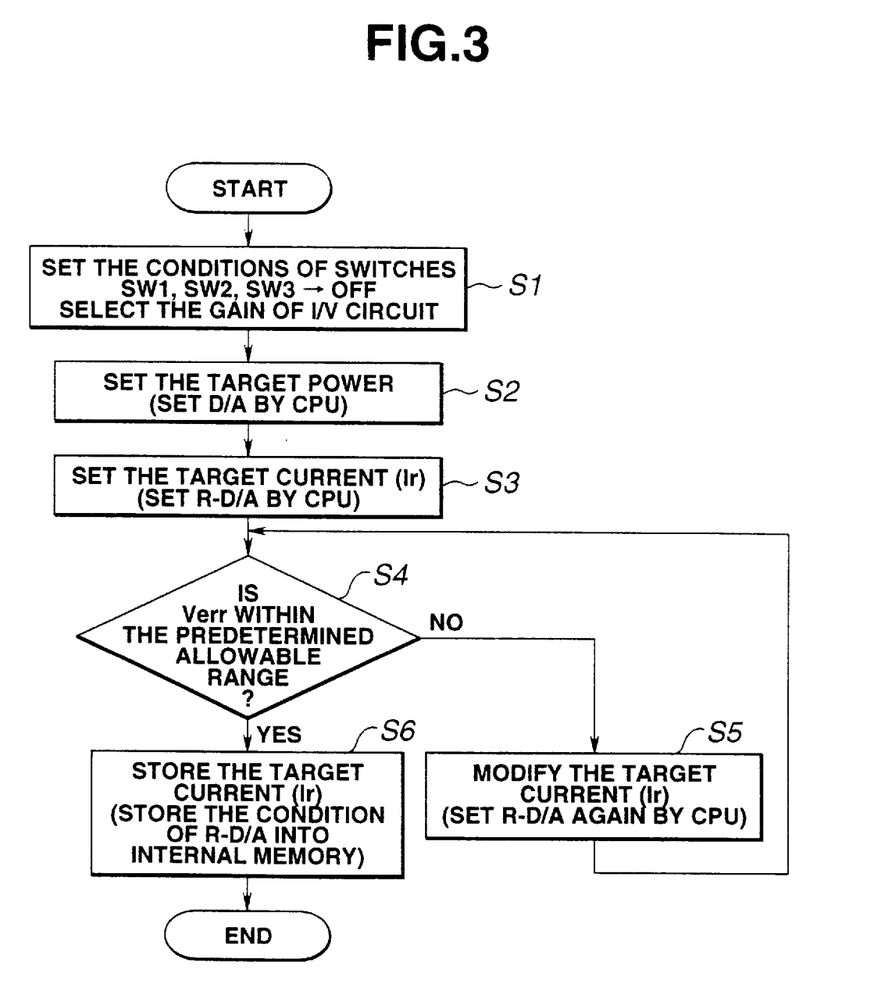
FIG. 3 is a flow chart illustrating the procedure of test light emission for setting the read power level with the semiconductor laser control circuit shown in FIG. 1.

In step S1 in the flow chart of FIG. 3, the CPU 4 turns off the switches SW1, Sw2, and SW3, and sets the gain (transimpedance) of the current-to-voltage conversion circuit 3 to a read-mode gain. Before the above setting operation, the output currents Ir, Iw0, Iw1, and Iw2 of the R-constant current circuit 14, W0-constant current circuit 15, W1-constant current circuit 16, W2-constant current circuit 17 are all maintained at 0 [mA].

In step S2, the CPU 4 refers to the read power setting table stored in a memory (not shown) provided inside or outside the CPU 4 so as to detect the optimum read power (hereafter referred to as the target read power Pr') depending on the type of an inserted disk and the temperature inside the drive. The CPU 4 then sets the D/A converter 6 so that it provides an output Vx corresponding to the target read power Pr'.

Then in step S3, the CPU 4 sets the R-D/A converter 10 so that the R-constant current circuit 14 can provide a proper output current in accordance with the output of the R-D/A converter 10. The initial setting value of the R-D/A converter 10 is selected so that the read power does not exceed the target read power Pr' even when the read power control loop gain becomes maximum as a result of variations in parameters such as the gain of the semiconductor laser driving circuit, the current-to-light conversion efficiency of the semiconductor laser, the light-to-current conversion efficiency of the photo detector, the gain of the current-to-voltage conversion circuit 3, and the gain of the operational amplifier 5.

In step S4, the CPU 4 checks the output of the operational amplifier 5 via the A/D converter 9 and judges whether the output of the A/D converter 9 is within a predetermined allowable bit range. If no, then the process goes to step S5 in which the CPU 4 corrects the setting associated with the R-D/A converter 10 so that the above output falls within the allowable range. Then the process returns to step S4.

The values of resistors are selected such that $$R1=R2 \text{ and } R3:R4:R5=2:2:1.$$

Therefore, the output (Verr) of the operational amplifier 5 is given by $$Verr=-Vin+Vx+(Vref/2)$$

where Vx denotes the specified output value of the D/A converter 6 corresponding to the target read power Pr'. Therefore, the setting of the R-D/A converter 10 is adjusted so that Vin becomes equal to Vx, that is, the output of the operational amplifier 5 becomes equal to Vref/2.

If it is concluded in step S4 that the output of the A/D converter 9 falls within the allowable bit range, the process goes to step S6 in which the CPU 4 stops checking the output of the R-D/A converter 10 and stores the setting value associated with the R-D/A converter 10 as the optimum read power Pr in the reading operation into the memory (not shown) provided inside or outside the CPU 4. Thus, the test light emitting operation for setting the read power Pr or the output current Ir is completed.

The setting of the output current Iw0 of the W0-constant current circuit 15 will be described below with reference to the flow chart of FIG. 4.

Figure 4:
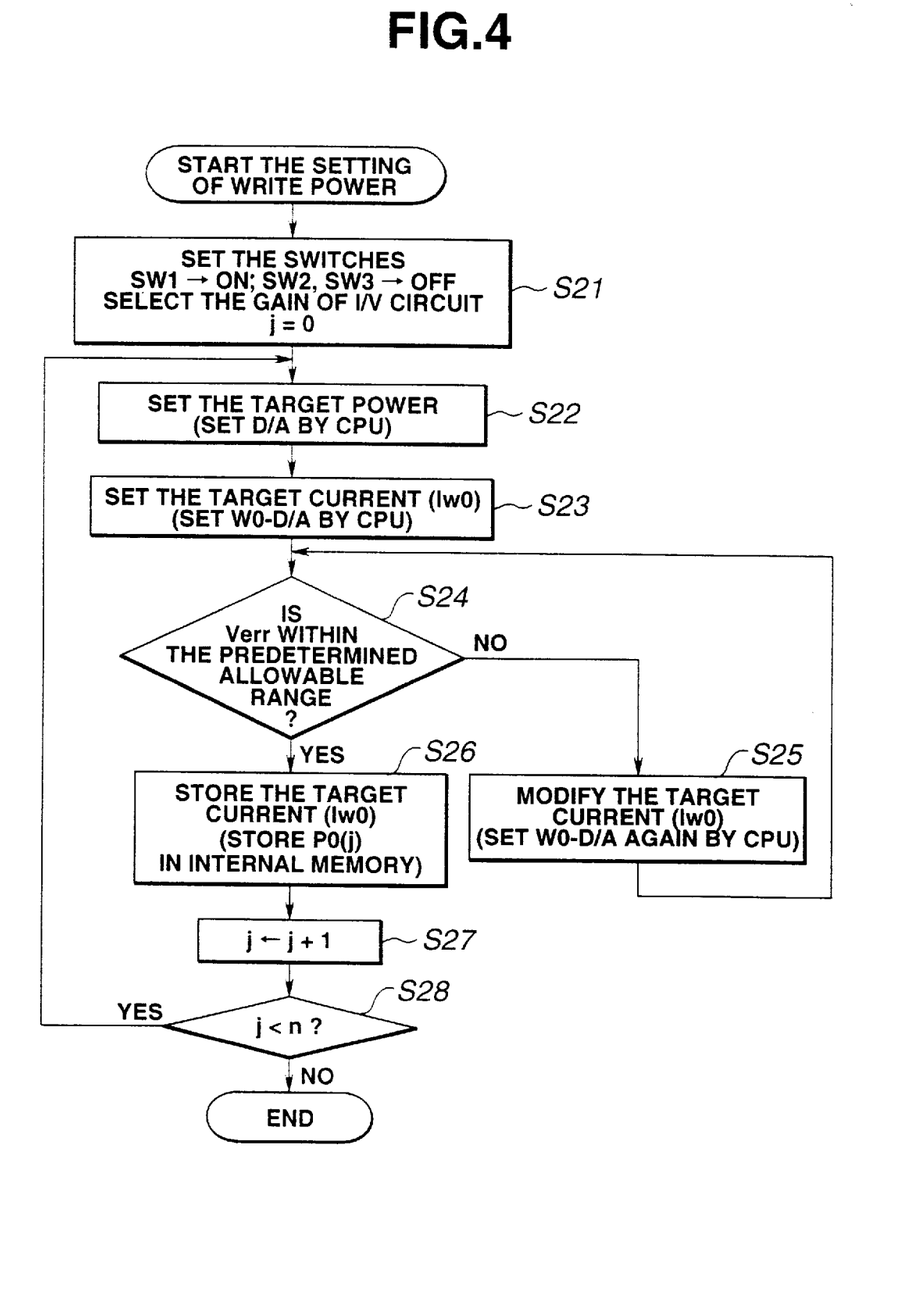
FIG 4 is a flow chart illustrating the procedure of test light emission for setting the write power level with the semiconductor laser control circuit shown in FIG. 1.

As shown in FIG. 4, in step S21, the CPU 4 turns on the switch SW1 and turns off the switches SW2 and SW3. Furthermore, the CPU 4 sets the current-to-voltage conversion gain (transimpedance) of the current-to-voltage conversion circuit 3 to a write-mode gain. Before the above setting operation, the output currents Iw0, Iw1, and Iw2 of the W0-constant current circuit 15, W1-constant current circuit 16, and W2-constant current circuit 17 are all maintained at 0 [mA], and the output current Ir of the R-constance current circuit 14 is set to a value which causes the semiconductor laser 1 to have a bias current corresponding to its threshold current. The CPU 4 also sets the parameter j to 0.

In step S22, the CPU 4 refers to the write power setting table stored in the memory (not shown) provided inside or outside the CPU 4 so as to detect the optimum write power (hereafter referred to as the target write power P0'(j) where j denotes the zone number from 0 to n) depending on the type of an inserted disk and the temperature inside the drive. The CPU 4 sets the D/A converter 6 so that its output corresponds to the target write power P0'(j).

Then in step S23, the CPU 4 sets the W0-D/A converter 11 so that the W0-constant current circuit 15 can provide a proper output current in accordance with the output of the W0-D/A converter 11. The initial setting value of the W0-D/A converter 11 is selected so that the read power does not exceed the target write power P0'(j) even when the write power control loop gain becomes maximum as a result of variations in parameters such as the gain of the semiconductor laser driving circuit, the current-to-light conversion efficiency of the semiconductor laser, the light-to-current conversion efficiency of the photo detector, the gain of the current-to-voltage conversion circuit, and the gain of the operational amplifier.

In step S24, the CPU 4 checks the output of the operational amplifier 5 via the A/D converter 9 and judges whether the output of the A/D converter 9 is within a predetermined allowable bit range. If no, then the process goes to step S25 in which the CPU 4 corrects the setting associated with the W0-D/A converter 11 so that the above output falls within the allowable range. Then the process returns to step S24.

In this specific embodiment, the values of the resistors are selected such that $$R1=R2 \text{ and } R3:R4:R5=2:2:1.$$

Therefore, the output (Verr) of the operational amplifier 5 is given by Verr=−Vin+Vx+(Vref/2) where Vx denotes the specified output value of the D/A converter 6 corresponding to the target read power P0'(j).

Therefore, the setting of the W0-D/A converter 11 is adjusted so that Vin becomes equal to Vx, that is, the output of the operational amplifier 5 becomes equal to Vref/2.

If it is concluded in step S24 that the output of the A/D converter 9 falls within the allowable bit range, the process goes to step S26 in which the CPU 4 stops checking the output of the A/D converter 9 and stores the setting value associated with the W0-D/A converter 11 as the optimum write power P0(j) for the zone j into the memory (not shown) provided inside or outside the CPU 4. Then in X step S27, j is incremented by 1. In step S28, the CPU 4 judges whether j is smaller than n. If j is smaller than n then the process returns to step S22 so as to repeat steps S22–S28. If it is concluded in step S28 that j is equal to or greater than n, the test light emitting operation for setting the write power is completed.

In this way, the optimum write power levels P0(0), . . . , P0(n) for the respective zones, that is, the output currents Iw0 for the respective zones, are set.

Iw1 and Iw2 are set without performing test light emitting operation. That is, in the erase/write operation, the CPU 4 refers to the above-described power table, and sets the gains of the voltage-controlled amplifiers 12 and 13 to values corresponding to the ratios of Iw1 and Iw2 relative to Iw0. Since the W0-constant current circuit 15, the W1-constant current circuit 16, and the W2-constant current circuit 17 all have the same voltage-to-current conversion gain, if the gains of the voltage-controlled amplifiers 12 and 13 are set in the above-described manner, then the output voltages of the voltage-controlled amplifiers 12 and 13 become Iw1/Iw0 and Iw2/Iw0 times the voltage for Iw0. The accuracy of the output voltage for Iw1 and Iw2 is similar to that for Iw0. Thus, there is no need for test light emission for Iw1 and Iw2.

When the erase power is equal to the write power (for example P1(j) or P2(j), the setting for the erase power may be performed using the same setting values as those for the write power. Also in the case where the target value of the erase power is different from that of the write power, the setting for the erase power may be performed by means of calculation based on the optimum write power level and the current-to-light conversion efficiency of the semiconductor laser, or may be performed in the same manner as in the setting for the write power.

Advantages

In the present embodiment of the invention, as described above, the semiconductor laser control circuit for controlling the operation of driving a semiconductor laser at a plurality of power levels can be realized using a single low-speed semiconductor laser monitor without having to use three high-speed APC circuits. This allows a reduction in the cost of the semiconductor laser control circuit.

The plurality of semiconductor laser driver circuit stages have the same gain so that the output power level may be easily set using the optimized semiconductor laser output setting value P0(j) which has been already determined thereby ensuring that power level setting can be performed easily in test light emission. This also allows a reduction in time required to perform test light emission for setting the power levels.

Figure 5:
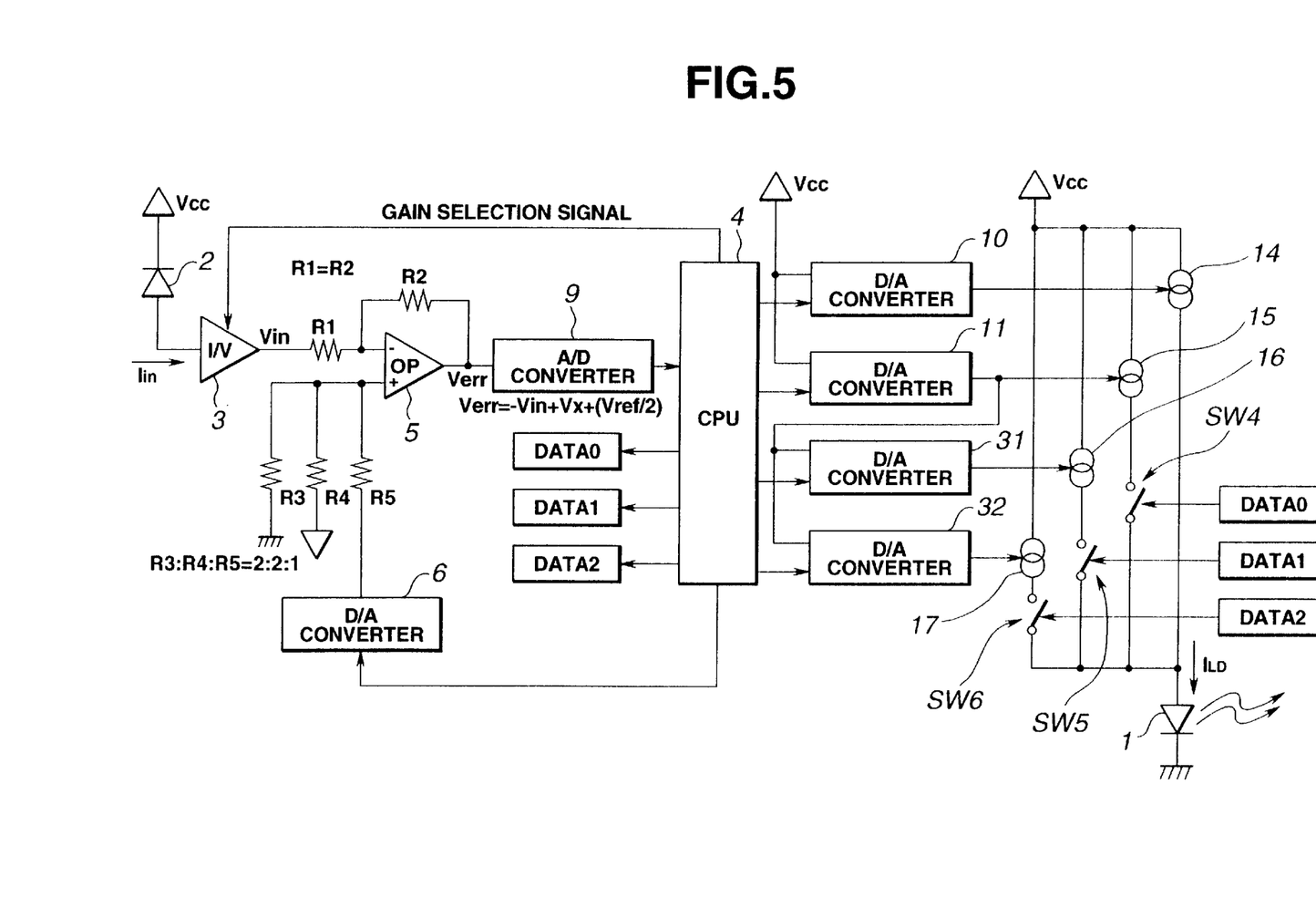
FIG. 5 is a circuit diagram illustrating a modification to the semiconductor laser control circuit shown in FIG. 1.

Although in this specific embodiment Iw1 and Iw2 are set by setting the voltage-controlled amplifiers 12 and 13 to have gains corresponding to the ratios of Iw1 and Iw2 to Iw0, Iw1 and Iw2 may also be set by properly setting the W1-D/A converter 31 and the W2-D/A converter 32 instead of setting the voltage-controlled amplifiers 12 and 13. In this case, the output voltage of the W0-D/A converter 11 may be employed as a reference voltage to set the W1-D/A converter 31 and the W2-D/A converter 32.

Second Embodiment

This second embodiment is similar to the first embodiment described above with some exceptions, and thus like parts are denoted by like reference numerals and these similar parts are not described herein in further detail.

Construction

Figure 6:
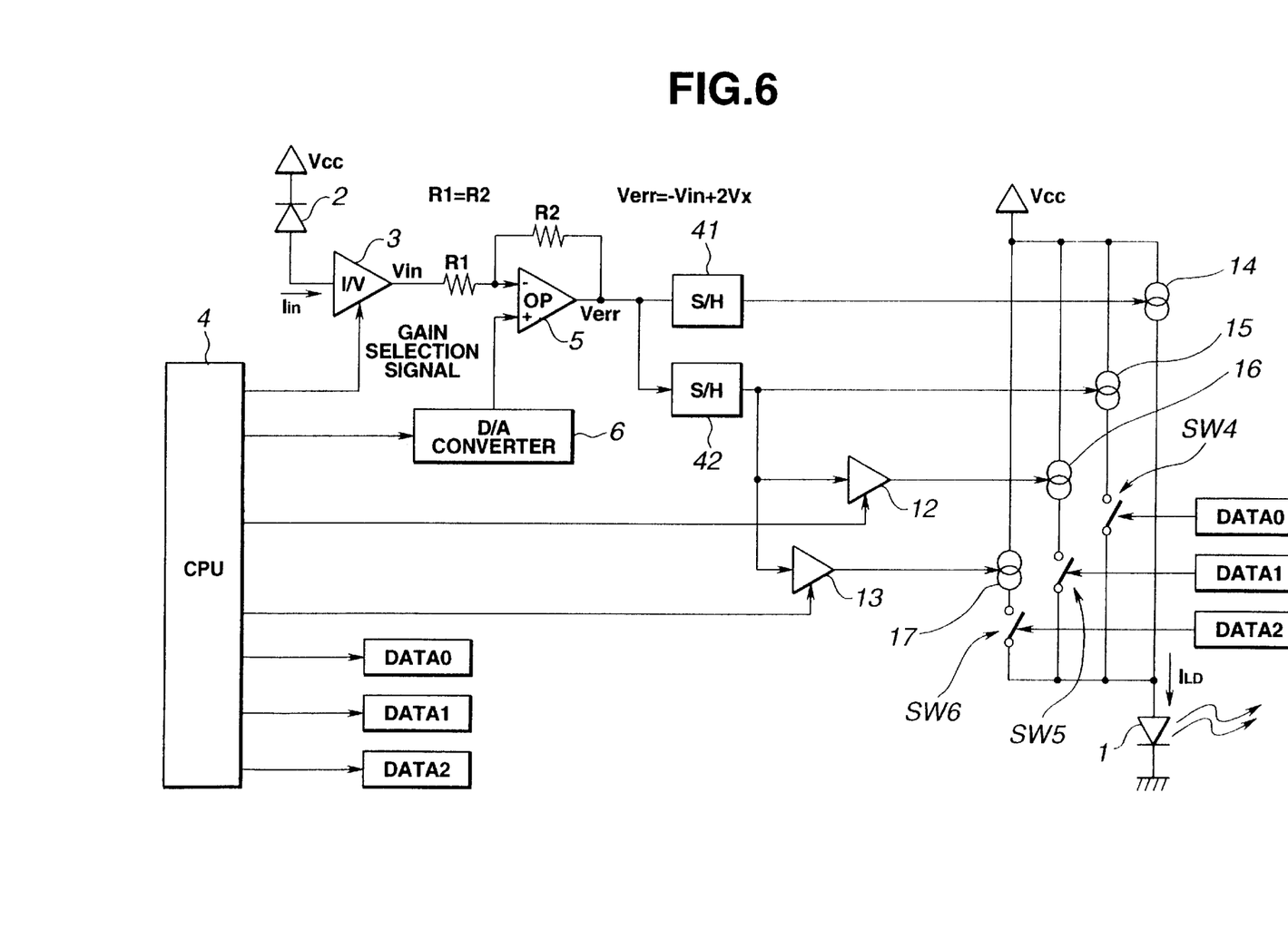
FIG. 6 is a circuit diagram illustrating the construction of a semiconductor laser control circuit.

In this second embodiment, as shown in FIG. 6, the positive input terminal of the operational amplifier 5 is directly connected to the D/A converter 6. Under the control of the CPU 4, the D/A converter 6 outputs a voltage corresponding to the output power of the semiconductor laser 1.

The output of the operational amplifier 5 is applied to sample-and-hold (S/H) circuits 41 and 42. The output of the R-constant current circuit 14 is determined by the output of the sample-and-hold circuit 41, and the output of the W0-constant current circuit 15 is determined by the output of the sample-and-hold circuit 42. The output voltage of the sample-and-hold circuit 42 is also applied to the voltage-controlled amplifiers 12 and 13. The gains of the voltage-controlled amplifier 12 and 13 are set by the CPU 4 in such a manner as to provide Iw1 and Iw2 having proper values relative to Iw0. It is assumed here that the voltage-to-current conversion gains of the W0-constant current circuit 15, the W1-constant current circuit 16, and the W2-constant current circuit 17 are equal to each other.

The other parts are constructed in the same manner as in the first embodiment.

Operation

The operation will now be described below for each mode.

The read power setting is performed in an ALPC area disposed in each sector according to the procedure described below.

Figure 7:
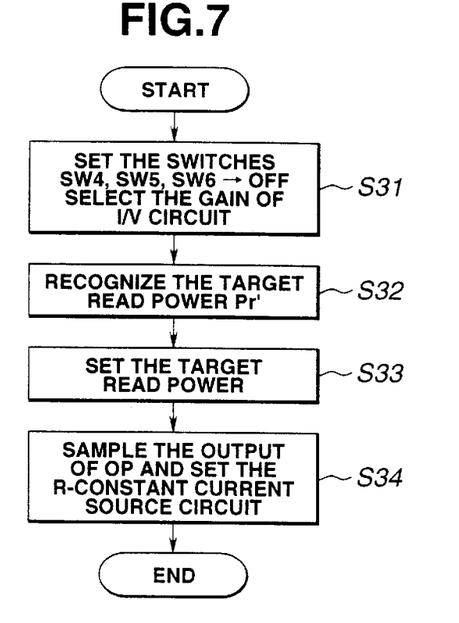
FIG. 7 is a flow chart illustrating the procedure of test light emission for setting the read power level with the semiconductor laser control circuit shown in FIG. 6.

First in step S31, as shown in FIG. 7, the CPU 4 turns off the switches SW4, SW5, and SW6 (into open states). Before this setting, the semiconductor laser driving currents Ir, Iw0, Iw1, and Iw2 are all maintained at 0 [mA]. The CPU 4 sets the current-to-voltage conversion gain of the current-to-voltage conversion circuit 3 to a read-mode gain.

In step S32, the CPU 4 refers to the read power setting table stored in the memory (not shown) provided inside or outside the CPU 4 so as to detect the optimum read power (hereafter referred to as the target read power Pr') depending on the type of an inserted disk and the temperature inside the drive.

Then in step S33, the CPU 4 sets the D/A converter 6 so that its output corresponds to the target read power Pr'.

In step S34, the semiconductor laser 1 emits a laser beam in accordance with the conditions determined in the above steps. Under the control of the CPU 4, the sample-and-hold circuit 41 samples the output of the operational amplifier 5 so that the optical output power of the semiconductor laser 1 becomes equal to the target power.

If the output of the D/A converter 6 corresponding to the target read power Pr' is denoted by Vx, the output Verr of the operational amplifier 5 is given by $$Verr = -Vin + 2Vx$$

The sample-and-hold circuit 41 sets the R-constant current circuit 14 so that the value of Verr sampled by the sample-and-hold circuit 41 becomes constant at Vx (corresponding to the target read power Pr').

If the optical output power of the semiconductor laser 1 becomes constant (at a level equal to the target read power Pr'), the output of the sample-and-hold circuit 41 is held. Alternatively, the optical output power of the semiconductor laser may be controlled (via the sampling operation) also in user data areas without holding the output of the sample-and-hold circuit 41.

In this way, the read power is adjusted by the processing from step S31 to step S34.

The erase/write power setting is performed in the ALPC area disposed in each sector according to the procedure described below.

Figure 8:
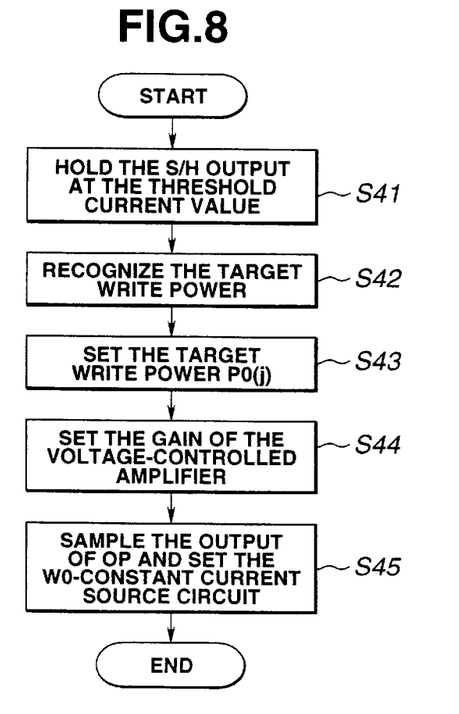
FIG. 8 is a flow chart illustrating the procedure of test light emission for setting the write power level with the semiconductor laser control circuit shown in FIG. 6.

In step S41, as shown in FIG. 8, the CPU 4 holds the output of the sample-and-hold circuit 41 at the threshold current value of the semiconductor laser 1. The CPU 4 also sets the current-to-voltage conversion gain of the current-to-voltage conversion circuit 3 to a write-mode gain. Before the above setting, the output of the D/A converter 6 is maintained at 0 [mA].

In step S42, the CPU 4 refers to the write power setting table stored in the memory (not shown) provided inside or outside the CPU 4 so as to detect the optimum write power (hereafter referred to as the target write power P0'(j) where j denotes the zone number from 0 to n) depending on the type of an inserted disk, the temperature inside the drive, and the recording area (such as zones).

Then in step S43, the CPU 4 sets the D/A converter 6 so that its output corresponds to the target write power P0'(j).

In step S44, the CPU 4 sets the gains of the voltage-controlled amplifiers 12 and 13 in accordance with the target write power P0'(j) so that Iw1 and Iw2 have proper values relative to Iw0.

Then in step S45, immediately when the scanning by the semiconductor laser reaches an ALPC area (or immediately before reaching the ALPC area), the CPU 4 turns on the switch SW4 and turns off the switches SW5 and SW6. Thus, the semiconductor laser emits a laser beam in accordance with the conditions determined in the above steps, and the sample-and-hold circuit 42 starts sampling the optical output power of the semiconductor laser 1 corresponding to Iw0.

If the output of the D/A converter 6 corresponding to the target write power P0'(j) is denoted by Vx, the output Verr of the operational amplifier 5 is given by $$Verr = -Vin + 2Vx.$$

The sample-and-hold circuit 42 sets the W0-constant current circuit 15 so that the value of Verr sampled by the sample-and-hold circuit 42 becomes constant at the Vx (corresponding to the target write power P0'(j)). If the optical output power of the semiconductor laser 1 becomes constant (at a level equal to the target write power P0'(j)), the output of the sample-and-hold circuit 42 is held.

In this way, the power setting in terms of Iw0 is completed.

As for Iw1 and Iw2, the power setting is made without performing test light emitting operation. That is, in step S44, the CPU 4 refers to the above-described power table, and sets the gains of the voltage-controlled amplifiers 12 and 13 to values determined by the ratios of Iw1 and Iw2 relative to Iw0. Since the W0-D/A converter 11, the W1-D/A converter 31, and the W2-D/A converter 32 all have the same conversion gain, if the gains of the voltage-controlled amplifiers 12 and 13 are set in the above-described manner, then the output voltages of the voltage-controlled amplifiers 12 and 13 become Iw1/Iw0 and Iw2/Iw0 times the voltage for Iw0. The accuracy of the output voltage for Iw1 and Iw2 is similar to that for Iw0.

After completion of the above power setting, the switches SW4, SW5, and SW6 are turned on and off in each recording area in response to DATA0, DATA1, and DATA2 corresponding to the recording data (WDATA) as shown in FIG. 2 thereby supplying the semiconductor laser driving current ILD to the semiconductor laser 1.

Advantages

In the present embodiment, as described above, the semiconductor laser control circuit for controlling the operation of driving a semiconductor laser at the plurality of power levels can be realized using the single low-speed semiconductor laser monitor (with a narrow control frequency band which is one-third that of a conventional circuit) without having to use three high-speed APC circuits. This allows a reduction in the cost of the semiconductor laser control circuit.

Figure 9:
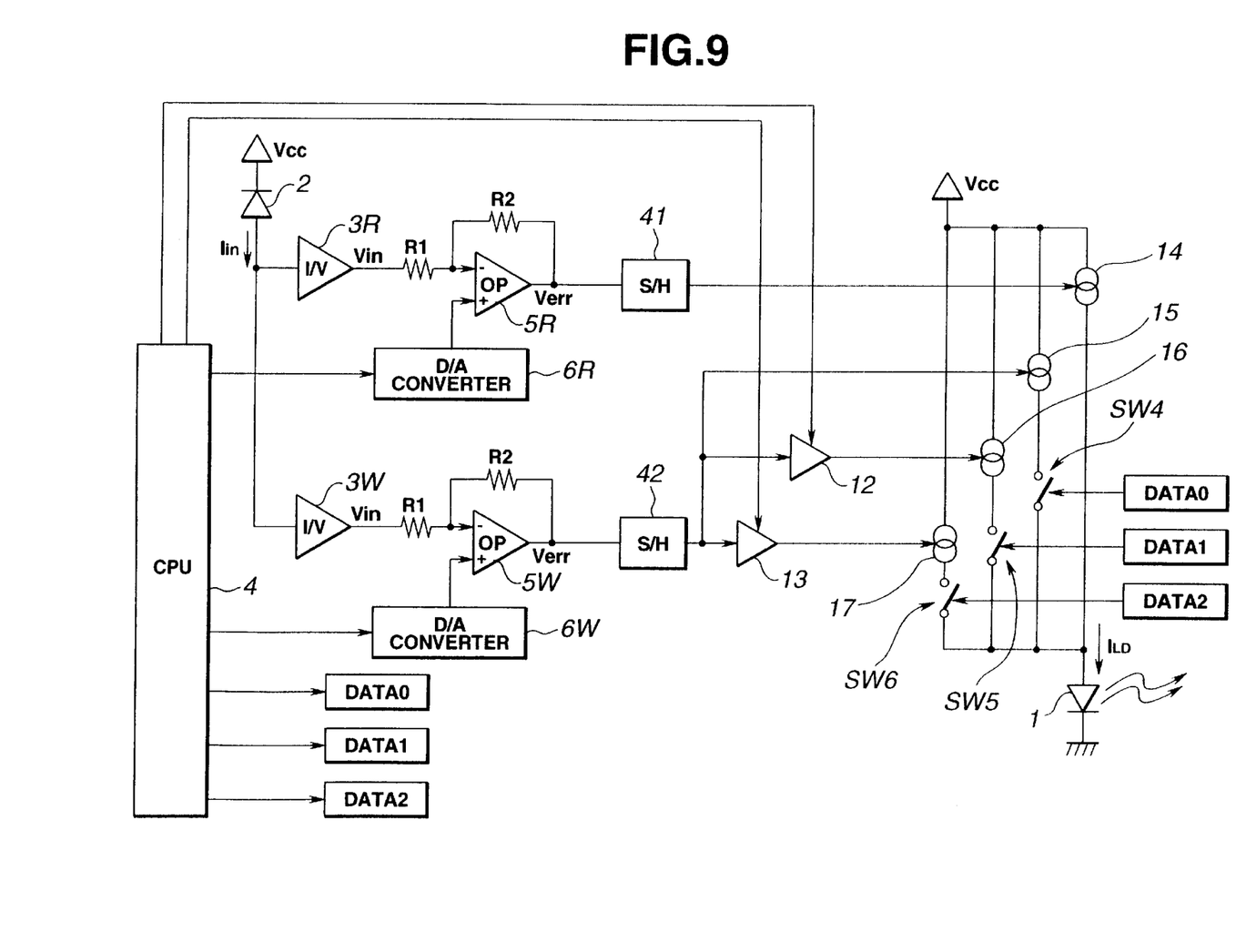
FIG. 9 is a circuit diagram illustrating a modification to the semiconductor laser control circuit shown in FIG. 6.

Although in this second embodiment the semiconductor laser control circuit includes the single monitor circuit composed of the variable-gain current-to-voltage conversion circuit 3 and the operational amplifier, the semiconductor laser may also include two monitor circuits composed of current-to-voltage conversion circuits 3R and 3W and operational amplifiers 5R and 5W, respectively, as shown in FIG. 9, whereby the power may be set in read and write/erase modes without varying the gain of the current-to-voltage conversion circuit 3.

Although the present invention has been described above with reference to certain exemplary embodiments, various modifications are possible without departing from the spirit and the scope of the invention. Thus it should be understood that the invention is limited only by the scope of the appended claims.

What is claimed is:

1. A semiconductor control circuit comprising:
   a semiconductor laser for illuminating an optical recording medium with a laser beam;
   first current setting means for setting a first driving current for driving said semiconductor laser;
   first current supplying means for supplying said first driving current to said semiconductor laser;
   second current setting means for setting a second driving current for driving said semiconductor laser, said second driving current being set on the basis of the output value of said first current setting means;
   second current supplying means for supplying said second driving current to said semiconductor laser;
   photo detector means for detecting the optical output of said semiconductor laser;
   current-to-voltage conversion means for converting a current signal supplied from said photo detector means into a voltage signal;
   power setting means for setting the optical output power of said semiconductor laser at one or more levels;
   comparison means for comparing the output of said power setting means with the output of said current-to-voltage conversion means; and
   control means for controlling the setting operation of said first current setting means in accordance with the comparison result of said comparison means.

2. A semiconductor laser control circuit according to claim 1, wherein said control means also controls the setting operation of said second current setting means in addition to the setting operation of said first current setting means.

3. A semiconductor laser control circuit according to claim 1, further comprising switching means for switching the current supplying means for supplying a current to said semiconductor laser between said first current supplying means and said second current supplying means, wherein at least one first current driving means formed with said first current supplying means and said switching means has a voltage-to-current conversion ratio equal to that of second current driving means formed with said second current supplying means and said switching means.

4. A semiconductor laser control circuit according to any of claims 1 to 3, wherein:
   said first current setting means comprises at least: read current setting means for setting a read current by which information is read from said optical recording medium; and first write current setting means for setting a first write current by which information is written on said optical recording medium;
   said first current supplying means comprises: read current supplying means for supplying said read current to said semiconductor laser; and first write current supplying means for supplying said first write current to said semiconductor laser;
   said second current setting means sets a second write driving current for driving said semiconductor laser on the basis of the output value of said first write current setting means;

said second current supplying means supplies said second write driving current to said semiconductor laser; and said control means controls the setting of said first write current setting means in accordance with the comparison result of said comparison means.

5. A semiconductor laser control circuit according to claim 4, wherein said first write current and said second write driving current are superimposed on said read current and supplied to said semiconductor laser.

6. A method of controlling a semiconductor laser, comprising:

a first step of setting a first driving current for driving a semiconductor laser for illuminating an optical recording medium with a laser beam;

a second step of detecting the optical output power of said semiconductor laser, comparing said detected optical output power with a reference value, and then comparing the result of said comparison with predetermined data;

a third step of correcting the setting value of said first driving current on the basis of the comparison result obtained in said second step, and stores the corrected setting value; and a fourth step of setting a second driving current for driving said semiconductor laser on the basis of said first driving current set according to said corrected setting value.

* * * * *